(12) United States Patent
Kim (10) Patent No.: US 7,312,655 B2
(45) Date of Patent: Dec. 25, 2007

(54) APPARATUS AND METHOD FOR CONTROLLING BIAS ADAPTATION BIAS OF A HIGH POWER AMPLIFIER

(75) Inventor: Kyoung-Tae Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 94 days.

(21) Appl. No.: 11/259,650

(22) Filed: Oct. 26, 2005

(65) Prior Publication Data

US 2006/0087373 A1    Apr. 27, 2006

(30) Foreign Application Priority Data

Oct. 27, 2004    (KR) ...................... 10-2004-0086389

(51) Int. Cl.
*H03F 3/04* (2006.01)
(52) U.S. Cl. ...................... 330/136; 330/285; 330/297
(58) Field of Classification Search ................ 330/136, 330/285, 296, 297
See application file for complete search history.

(56) References Cited

U.S. PATENT DOCUMENTS 7,193,470 B2 *   3/2007   Lee et al. .................... 330/136

* cited by examiner

*Primary Examiner*—Khanh Van Nguyen
(74) *Attorney, Agent, or Firm*—The Farrell Law Firm (57) ABSTRACT

An apparatus and a method for controlling a bias adaptation bias of a high power amplifier. In the high power amplifier, a coupling operation is performed with respect to an input signal with a predetermined voltage, an amount of attenuation used for attenuating a voltage of the coupled input signal is adjusted corresponding to the voltage of the input signal, a bias adaptation bias is created correspondingly to a voltage obtained by attenuating the voltage of the input signal by the amount of the attenuation, and the coupled input signal is amplified corresponding to the bias adaptation bias, thereby performing a signal amplifying operation for maintaining linearity of an input signal, regardless of an average input voltage intensity of the input signal.

8 Claims, 7 Drawing Sheets

APPARATUS AND METHOD FOR CONTROLLING BIAS ADAPTATION BIAS OF A HIGH POWER AMPLIFIER

PRIORITY

This application claims priority to an application entitled "Apparatus and Method for Controlling Bias Adaptation Bias of High Power Amplifier" filed in the Korean Intellectual Property Office on Oct. 27, 2004 and assigned Serial No. 2004-86389, the contents of which are incorporated herein by reference.

BACKGROUND OF THE INVENTION

1. Field of the Invention

The present invention relates generally to an apparatus and a method for controlling a bias of a high power amplifier, and more particularly to an apparatus and a method for controlling a bias adaptation bias corresponding to a voltage intensity of an input signal of a high power amplifier using a bias adaptation scheme.

2. Description of the Related Art

Currently, a high power amplifier (HPA) is mounted in the final output ports of a base station (BS) and mobile stations (MSs) used in a mobile communication system. When considering the efficiency of the high power amplifier, the sizes of devices in which the high power amplifier is mounted, i.e., the base station and the mobile stations, power consumption of the high power amplifier, and a heat radiation structure of the high power amplifier must be taken into account. In particular, research has been actively pursued to provide a variety of schemes for increasing the efficiency of the high power amplifier because the high power amplifier has a limitation in view of performance-cost, i.e., it is very expensive for a high power amplifier to maintain the linearity of an output voltage thereof.

The most commonly used scheme for increasing the efficiency of a high power amplifier is a bias adaptation scheme. The bias adaptation scheme controls a bias supplied to the high power amplifier according to a voltage intensity of a signal input to the high power amplifier, i.e., the magnitude of the envelope of the input signal. That is, the bias adaptation scheme controls a bias supplied to the high power amplifier, thereby improving the driving capability of the high power amplifier, i.e., the linearity of an output signal of the high power amplifier, thereby increasing the efficiency of the high power amplifier.

Figure 1:
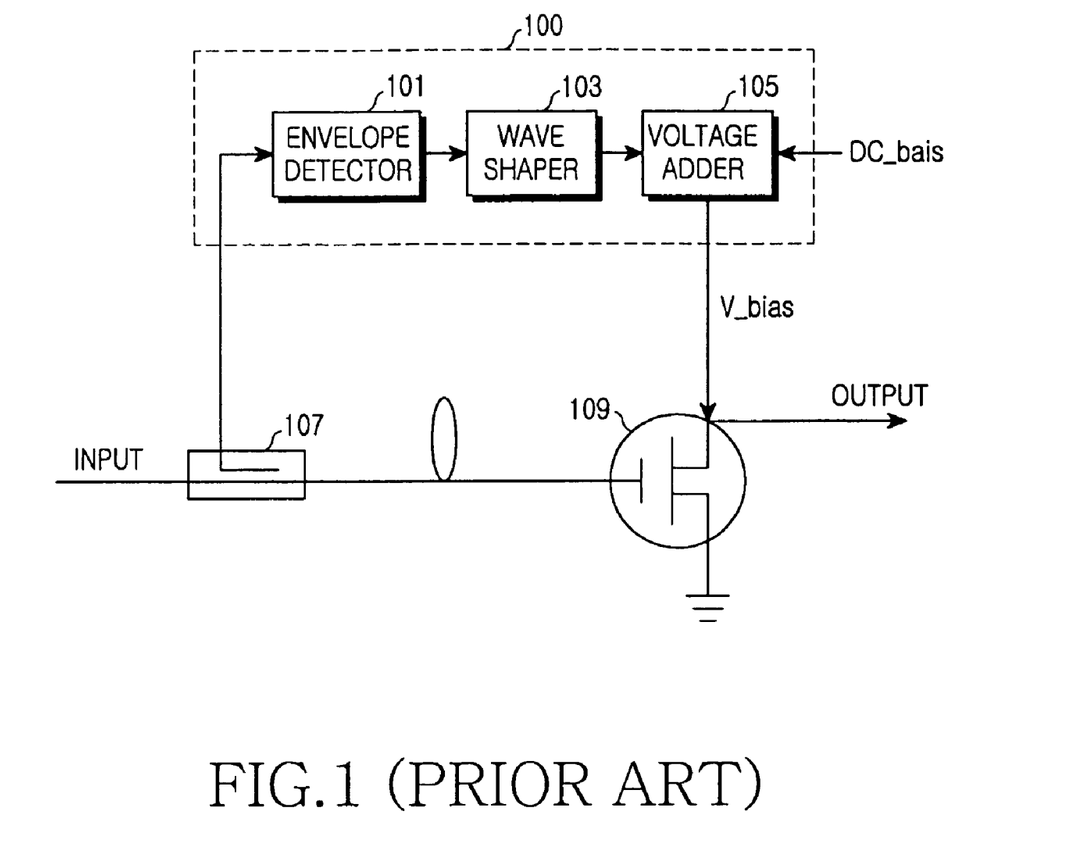
FIG. 1 is a schematic block diagram illustrating a high power amplifier using a conventional bias adaptation scheme.

FIG. 1 is a schematic block diagram illustrating a high power amplifier using a conventional bias adaptation scheme. Referring to FIG. 1, the high power amplifier includes a bias adaptation block 100, a coupler 107, and a transistor 109. The bias adaptation block 100 includes an envelope detector 101, a wave shaper 103, and a voltage adder 105.

If a signal is input to the high power amplifier, the input signal is sent to the coupler 107. The coupler 107 performs a coupling operation for the input signal and then outputs the input signal to the envelope detector 101 of the bias adaptation block 100 and the transistor 109. The coupler 107 lowers an average voltage of the input signal to a value corresponding to an operating voltage interval of the envelope detector 101 by performing the coupling operation for the input signal, because the envelope detector 101 operates at a relatively lower voltage intensity.

The envelope detector 101 receives the signal output from the coupler 107, detects the envelope of the received signal, and removes a high frequency component from the received signal having undergone the coupling operation, thereby outputting only an envelope of the received signal to the wave shaper 103.

Figure 2:
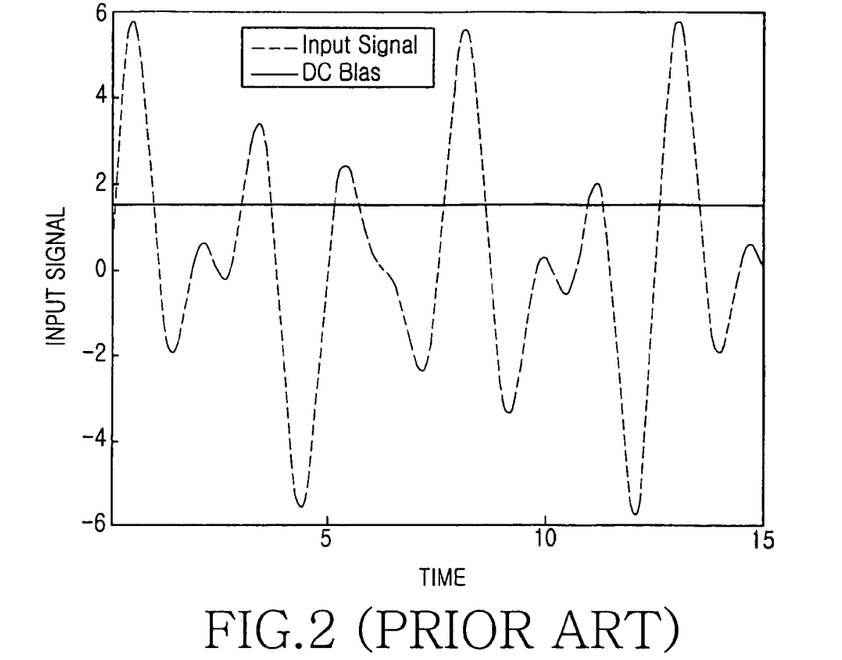
FIG. 2 is a graph illustrating an envelope of a signal output from an envelope detector illustrated in FIG. 1.

FIG. 2 is a graph illustrating an envelope of the signal output from the envelope detector 101 illustrated in FIG. 1. "DC_bias" in FIG. 2 represents a direct current bias input to the high power amplifier. The envelope of the signal exists both above the direct current bias DC_bias and below the direct current bias DC_bias as illustrated in FIG. 2.

The wave shaper 103 receives the envelope of the signal output from the envelope detector 101, controls the envelope of the signal in such a manner that the signal has a predetermined waveform, and outputs an alternating current (AC) voltage signal swinging only above a predetermined voltage intensity to the voltage adder 105. The voltage adder 105 receives the AC voltage signal output from the wave shaper 103 and the direct current bias DC_bias input to the high power amplifier in order to add the AC voltage signal to the direct current bias DC_bias and outputs the resultant value, i.e., a bias adaptation bias V_bias provided as a bias of the transistor 109, to the transistor 109.

Figure 3:
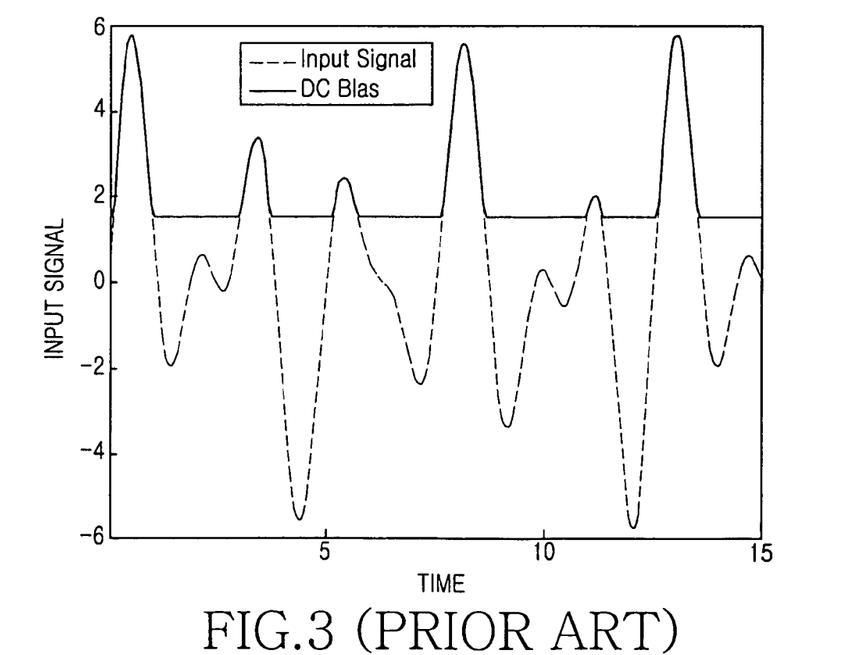
FIG. 3 is a graph illustrating a bias adaptation bias V_bias output from a voltage adder 105 illustrated in FIG. 1.

FIG. 3 is a graph illustrating a bias adaptation bias V_bias output from the voltage adder 105 illustrated in FIG. 1. More specifically, the bias adaptation bias V_bias illustrated in FIG. 3 represents a signal output from the voltage adder 105, i.e., a bias provided to the transistor 109 as illustrated in FIG. 1.

Referring to FIG. 3, if a voltage intensity of a signal input to the high power amplifier exceeds the intensity of a predetermined threshold voltage, the bias adaptation bias V_bias is created by adding the AC voltage signal above the predetermined threshold voltage to the DC_bias.

A high power amplifier used for a base station and mobile communication terminals used in the mobile communication system is generally realized using a lateral double diffused metal-oxide semiconductor (LDMOS). That is, an LDMOS having a usage DC voltage of 28[V] and a DC voltage of ensuring the normal use of the high power amplifier without shutting down the high power amplifier, i.e., the maximum available DC voltage of 32[V], is commonly used for the high power amplifier. If a usage DC voltage and the maximum available DC voltage are determined for the high power amplifier even though the values vary with characteristics of various kinds of devices used as the high power amplifier, and a voltage above the maximum available DC voltage is applied to the high power amplifier, the high power amplifier may be shut down, so that it is impossible to normally use the high power amplifier.

Accordingly, the high power amplifier must be designed in such a manner that both a usage DC voltage provided to the high power amplifier through the bias adaptation scheme and a voltage obtained by adding a direct current bias to a bias adaptation bias can swing without exceeding the maximum available DC voltage.

As described above, because the high power amplifier has a limitation in view of the maximum available DC voltage, even though the bias adaptation scheme is used, there is a limitation in the improvement of the linearity of the high power amplifier. That is, because a voltage of an input signal applied to the high power amplifier is restricted to the maximum available DC voltage intensity so that the voltage has a relatively smaller voltage intensity, even though the high power amplifier supplies a voltage swinging up to the maximum available DC voltage, it is difficult to ensure the linearity of the output voltage of the high power amplifier.

Accordingly, various linear zed schemes for ensuring the linearity of the output voltage of the high power amplifier have been actively researched and employed.

Because the usage DC voltage and the maximum available DC voltage must be considered as described above, the high power amplifier is designed such that it ensures the linearity in the average maximum output voltage of the high power amplifier. Accordingly, the high power amplifier is designed in such a manner that the output voltage of the high power amplifier can be ensured by using a bias adaptation scheme for the average maximum output voltage.

Figure 4:
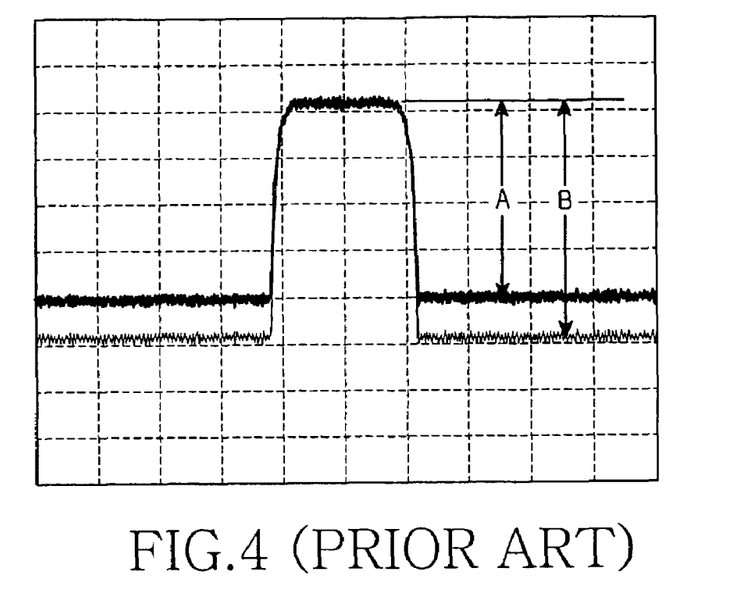
FIG. 4 is a frequency spectrum illustrating a spurious characteristic of an average maximum output voltage when a conventional high power amplifier uses a bias adaptation scheme.

FIG. 4 is a frequency spectrum illustrating a spurious characteristic of an average maximum output voltage when a conventional high power amplifier utilizes a bias adaptation scheme. Referring to FIG. 4, a plurality of schemes exist for showing a spurious characteristic, which is a parameter representing the linearity of the high power amplifier. In general, a scheme of showing the spurious characteristic based on a power difference between neighbor channels according to carrier signal intensity is used.

The spurious characteristic of the average maximum voltage of the high power amplifier illustrated in FIG. 4 represents that the superior linearity can be represented under the same average maximum output voltage of the high power amplifier when the bias adaptation scheme is used. That is, as illustrated in FIG. 4, a spurious characteristic B in the average maximum output voltage of the high power amplifier when the bias adaptation scheme is utilized is superior to a spurious characteristic A in the average maximum output voltage of the high power amplifier when the bias adaptation scheme is not used.

Additionally, when the bias adaptation scheme is not used, and an average input voltage of an input signal applied to the high power amplifier is lowered, it is possible to obtain a spurious characteristic that is superior to a spurious characteristic in the average maximum output voltage output from the high power amplifier. However, because the high power amplifier is designed based on the average maximum output voltage thereof, when the bias adaptation scheme is used, an improved spurious characteristic is provided with respect to an identical output voltage as compared with when the bias adaptation scheme is not used. When the bias adaptation scheme is used, a spurious characteristic of an output voltage is identical to that of when the bias adaptation scheme is not employed, and the average input voltage of the input signal applied to the high power amplifier is lowered.

Figure 5:
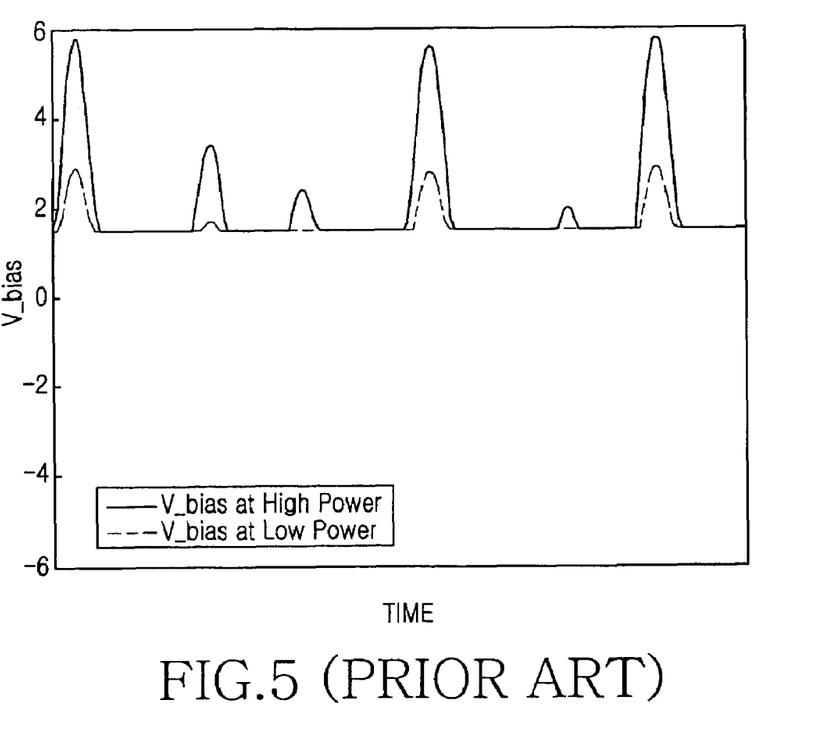
FIG. 5 is a graph illustrating characteristics of a bias adaptation bias V_bias provided to a transistor when an average input voltage is lowered.

FIG. 5 is a graph illustrating a characteristic of the bias adaptation bias V_bias provided to the transistor 109 illustrated in FIG. 1 when the average input voltage is lowered. Referring to FIG. 5, if the average input voltage of the input signal applied to the high power amplifier is lowered, an output voltage of the envelope detector 101 detecting the envelope of the input signal applied to the high power amplifier is remarkably reduced. The reduction of the output voltage of the envelope detector 101 enables the bias adaptation bias V_bias applied to the transistor 109 to be approximately equal to the usage DC voltage of the high power amplifier, so that it may become equal to when the bias adaptation scheme is not used.

Accordingly, although the bias adaptation scheme is utilized, the linearity of the output voltage is shown similarly to when the bias adaptation scheme is not used, so that the efficiency of the high power amplifier is lowered. That is, although the average input voltage of the input signal applied to the high power amplifier is lowered when the bias adaptation scheme is used, the linearity of the output voltage is not ensured because a signal that must be amplified by the high power amplifier does not exist in a linear area.

Figure 6:
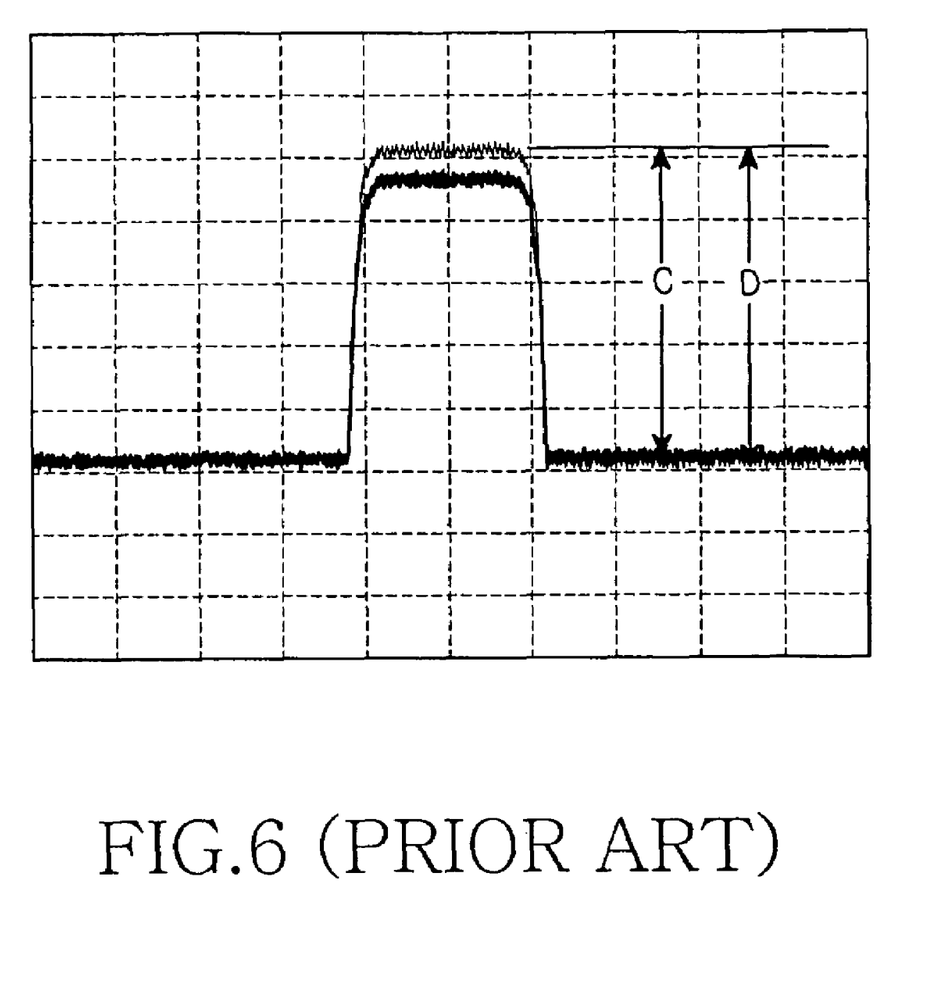
FIG. 6 is a frequency characteristic illustrating a spurious characteristic in an output voltage of a conventional high power amplifier when an average input voltage of the conventional high power amplifier is lowered.

FIG. 6 is a frequency characteristic illustrating a spurious characteristic in an output voltage of a conventional high power amplifier when an average input voltage of the conventional high power amplifier is lowered. Referring to FIG. 6, a spurious characteristic C in the average maximum output voltage of the high power amplifier when the bias adaptation scheme is used is identical to a spurious characteristic B in the average maximum output voltage of the high power amplifier when the bias adaptation scheme is used, as illustrated in FIG. 4. In addition, a spurious characteristic D in an output voltage of the high power amplifier when the bias adaptation scheme is used, and the average input voltage provided to the high power amplifier is lowered has a deteriorated characteristic, and shows that the output voltage is reduced even though the average input voltage is lowered, because an output voltage of the envelope detector 101 is remarkably reduced according to the reduction of the average input voltage.

As described above, when the bias adaptation scheme is utilized, and the average input voltage of the input signal applied to the high power amplifier is reduced, an output voltage of the high power amplifier is reduced, and a spurious characteristic in the output voltage is more deteriorated. Accordingly, when the bias adaptation scheme is utilized, it is necessary to prevent the reduction of the output voltage of the high power amplifier and the deterioration of the spurious characteristic even though the average input voltage of the input signal applied to the high power amplifier is reduced.

SUMMARY OF THE INVENTION

Accordingly, the present invention has been designed to solve the above and other problems occurring in the prior art.

An object of the present invention is to provide an apparatus and a method for controlling a bias adaptation bias corresponding to voltage intensity of an input signal of a high power amplifier using a bias adaptation scheme.

Another object of the present invention is to provide an apparatus and a method for controlling a bias adaptation bias in such a manner that an output voltage characteristic is maintained even when an average input voltage is reduced in a high power amplifier using a bias adaptation scheme.

To accomplish the above and other objects, there is provided an apparatus for controlling a bias adaptation bias of a high power amplifier. The apparatus comprises a coupler for coupling an input signal to have a predetermined voltage; an amplification element for amplifying the coupled input signal corresponding to a bias adaptation bias created according to a predetermined control operation; and a bias adaptation block for adjusting an amount of attenuation used for attenuating a voltage of the coupled input signal corresponding to the voltage of the coupled input signal and creating the bias adaptation bias corresponding to a voltage obtained by attenuating the voltage of the coupled input signal by the amount of the attenuation.

According to another aspect of the present invention, there is provided a method for controlling a bias adaptation bias of a high power amplifier. The method comprises the steps of coupling an input signal to have a predetermined voltage; adjusting an amount of attenuation used for attenuating a voltage of the coupled input signal corresponding to the voltage of the coupled input signal; creating a bias adaptation bias corresponding to a voltage obtained by attenuating the voltage of the coupled input signal by the amount of the attenuation; and amplifying the coupled input signal corresponding to the bias adaptation bias.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE PREFERRED EMBODIMENT

Preferred embodiments of the present invention will be described in detail herein below with reference to the accompanying drawings. It is noted that the same or similar components in drawings are designated by the same reference numerals as far as possible although they are shown in different drawings. Additionally, in the following description of the present invention, a detailed description of known functions and configurations incorporated herein will be omitted when it may obscure the subject matter of the present invention.

The present invention is directed an apparatus and a method for controlling a bias adaptation bias corresponding to voltage intensity of an input signal applied to a high power amplifier using a bias adaptation scheme. In particular, the present invention proposes an apparatus and a method for controlling a bias adaptation bias in such a manner that an output voltage characteristic, i.e., output voltage intensity and a spurious characteristic, is maintained, even when an average input voltage of an input signal applied to the high power amplifier is reduced.

Figure 7:
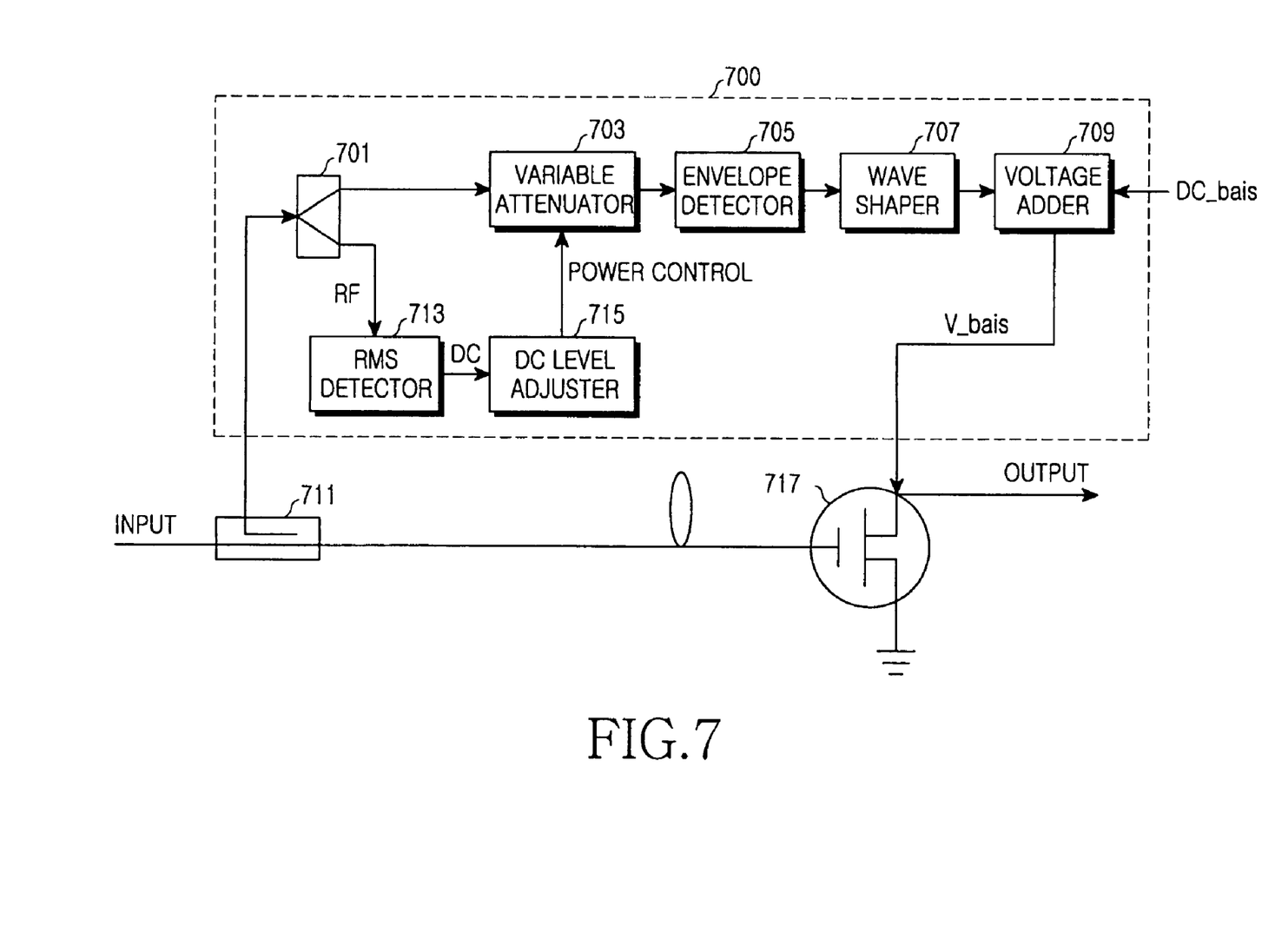
FIG. 7 is a block diagram illustrating a high power amplifier performing functions according to an embodiment of the present invention.

FIG. 7 is a block diagram illustrating a high power amplifier performing functions according to an embodiment of the present invention. Referring to FIG. 7, the high power amplifier includes a bias adaptation block 700, a coupler 711, and a transistor 717. Further, the bias adaptation block 700 includes a power divider 701, a variable attenuator 703, an envelope detector 705, a wave shaper 707, a voltage adder 709, a root mean square (RMS) detector 713, and a direct current (DC) level adjuster 715. Herein, other amplification elements may be used in addition to the transistor 717.

When a signal is input to the high power amplifier, the input signal is delivered to the coupler 711. The coupler 711 performs a coupling operation for the input signal and then outputs the input signal to the power divider 701 of the bias adaptation block 700 and the transistor 717. In the high power amplifier according to an embodiment of the present invention, because the signal having undergone the coupling operation by means of the coupler 711 passes through the power divider 701 and the variable attenuator 703 and is then input to the envelope detector 705, the signal has intensity different from the intensity of a signal input to an envelope detector of a high power amplifier using the conventional bias adaptation scheme.

More specifically, because a signal having the same intensity, i.e. the same voltage intensity, as a signal input to the envelope detector of the high power amplifier using the conventional bias adaptation scheme must be input to the envelope detector 705, the coupler 711 performs the coupling operation for the input signal by compensating for an amount Atn of attenuation of the variable attenuator 703.

The power divider 701 receives and power-divides the input signal having undergone the coupling operation output from the coupler 711 and then outputs the input signal to the variable attenuator 703 and the RMS detector 713. Herein, the signal output to the variable attenuator 703 and the RMS detector 713 includes a radio frequency (RF) signal. The variable attenuator 703 receives the signal output from the power divider 701, attenuates the voltage of the signal by a predetermined amount Atn of attenuation, and then outputs the attenuated signal to the envelope detector 705. The variable attenuator 703 may be realized as a reflection-type variable attenuator using a variable resistor characteristic according to a voltage of a PIN diode.

Figure 8:
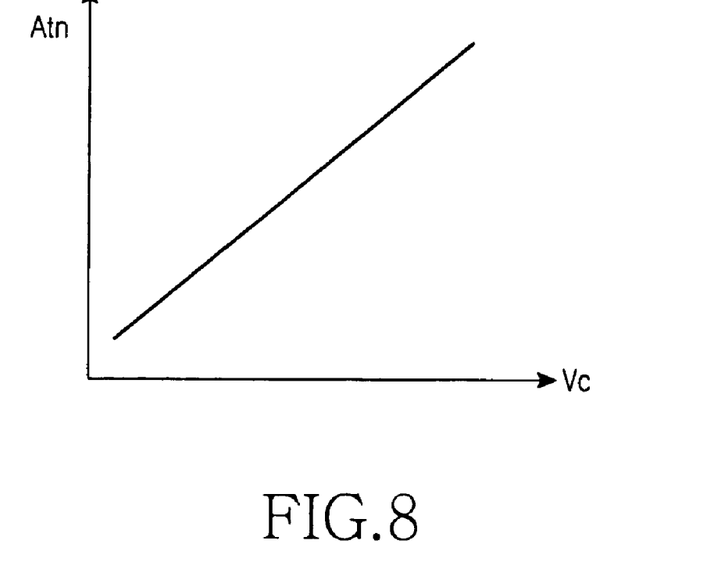
FIG. 8 is a graph illustrating a characteristic of an amount Atn of attenuation corresponding to a control voltage of a variable attenuator as illustrated in FIG. 7.

FIG. 8 is a graph illustrating a characteristic of an amount Atn of attenuation corresponding to a control voltage of the variable attenuator 703. Referring to FIG. 8, when a lower control voltage Vc is applied to the variable attenuator 703, the amount Atn of attenuation of the variable attenuator 703 decreases. However, when a higher control voltage Vc is applied to the variable attenuator 703, the amount Atn of attenuation of the variable attenuator 703 increases. As a result, when the lower control voltage Vc is applied to the variable attenuator 703, the amount Atn of attenuation of the variable attenuator 703 decreases, such that a voltage of a signal input to the envelope detector 705 increases. However, when the higher control voltage Vc is applied to the variable attenuator 703, the amount Atn of attenuation of the variable attenuator 703 increases, such that the voltage of the signal input to the envelope detector 705 decreases.

According to an embodiment of the present invention, because efficiency in a case in which the bias adaptation scheme is used decreases when a voltage of a signal input to the envelope detector 705 decreases as described in the conventional technique, the amount Atn of attenuation of the variable attenuator 703 is adjusted corresponding to the intensity of the input signal, such that the voltage of the input signal applied to the envelope detector 705 is always maintained as a predetermined value by decreasing the amount Atn of attenuation of the variable attenuator 703, even though the intensity of the input signal is lowered.

The amount Atn of attenuation of the variable attenuator 703 is adjusted according to a control voltage Vc of the DC level adjuster 715. As described above, a signal output from the power divider 701 is applied to the RMS detector 713. The RMS detector 713 receives the signal output from the power divider 701 in order to convert an average input voltage of the received signal into a DC voltage and then outputs the DC voltage to the DC level adjuster 715. The DC level adjuster 715 receives the DC voltage output from the RMS detector 713 to adjust the DC voltage to a DC voltage on an operation domain and then outputs the DC voltage to the variable attenuator 703.

Because the DC level adjuster 715 adjusts an average input voltage of the received signal to a DC voltage value on the operation domain of the variable attenuator 703, regardless of the value of the average input voltage, and then outputs the received signal to the variable attenuator 703, a voltage of a signal input to the envelope detector 705 is maintained as a predetermined value. Herein, because an input signal applied to the variable attenuator 703, i.e., an RF signal is used when the amount Atn of the attenuation of the variable attenuator 703 is adjusted, an additional processing delay for adjusting the amount Atn of the attenuation of the variable attenuator 703 does not occur.

To summarize, when an average input voltage of an input signal applied to the high power amplifier is decreased, a DC voltage output from the RMS detector 713 is decreased, and the amount Atn of the attenuation of the variable attenuator 703 is decreased due to the decreased DC voltage, such that a voltage of a signal applied to the envelope detector 705 can be maintained as a predetermined value.

However, when the average input voltage of the input signal of the high power amplifier is increased, a DC voltage output from the RMS detector 713 is increased, and the amount Atn of attenuation of the variable attenuator 703 is increased due to the increased DC voltage, such that the voltage of the signal applied to the envelope detector 705 can be maintained as a predetermined value.

Accordingly, the high power amplifier maintains the characteristic described with reference to FIG. 3 in the conventional technique regardless of the intensity of the average input voltage of the input signal applied to the high power amplifier, and an output voltage characteristic of the high power amplifier is improved when a signal having a smaller input voltage is applied to the high power amplifier.

Figure 9:
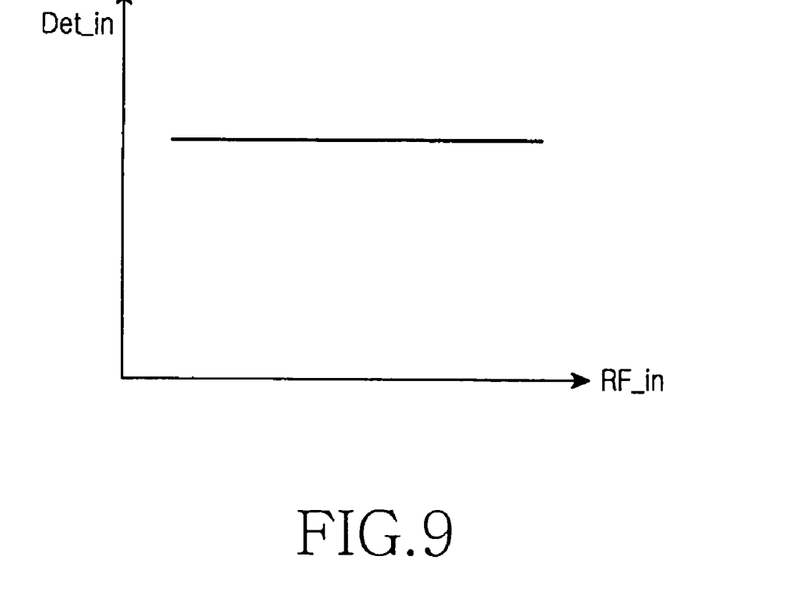
FIG. 9 is a graph illustrating a relationship between a voltage RF_in of an input signal of a high power amplifier as illustrated in FIG. 7 and a voltage Det_in of an input signal of an envelope detector.

FIG. 9 is a graph illustrating the relationship between the voltage RF_in of the input signal applied to the high power amplifier and the voltage Det_in of the input signal applied to the envelope detector 705.

As described above, according to the present invention, when an average input voltage RF_in of an input signal applied to the high power amplifier is decreased, a DC voltage output from the RMS detector 713 is decreased, and the amount Atn of the attenuation of the variable attenuator 703 is decreased due to the decreased DC voltage, such that a voltage Det_in of a signal applied to the envelope detector 705 can be maintained as a predetermined value.

However, when the average input voltage RF_in of the input signal of the high power amplifier is increased, a DC voltage output from the RMS detector 713 is increased, and the amount Atn of the attenuation of the variable attenuator 703 is increased due to the increased DC voltage, such that the voltage Det_in of the signal applied to the envelope detector 705 can be maintained as a predetermined value.

Accordingly, the relationship between the voltage RF_in of the input signal applied to the high power amplifier and the voltage Det_in of the input signal applied to the envelope detector 705 is constantly maintained, regardless of the intensity of the voltage RF_in of the input signal of the high power amplifier.

Figure 10:
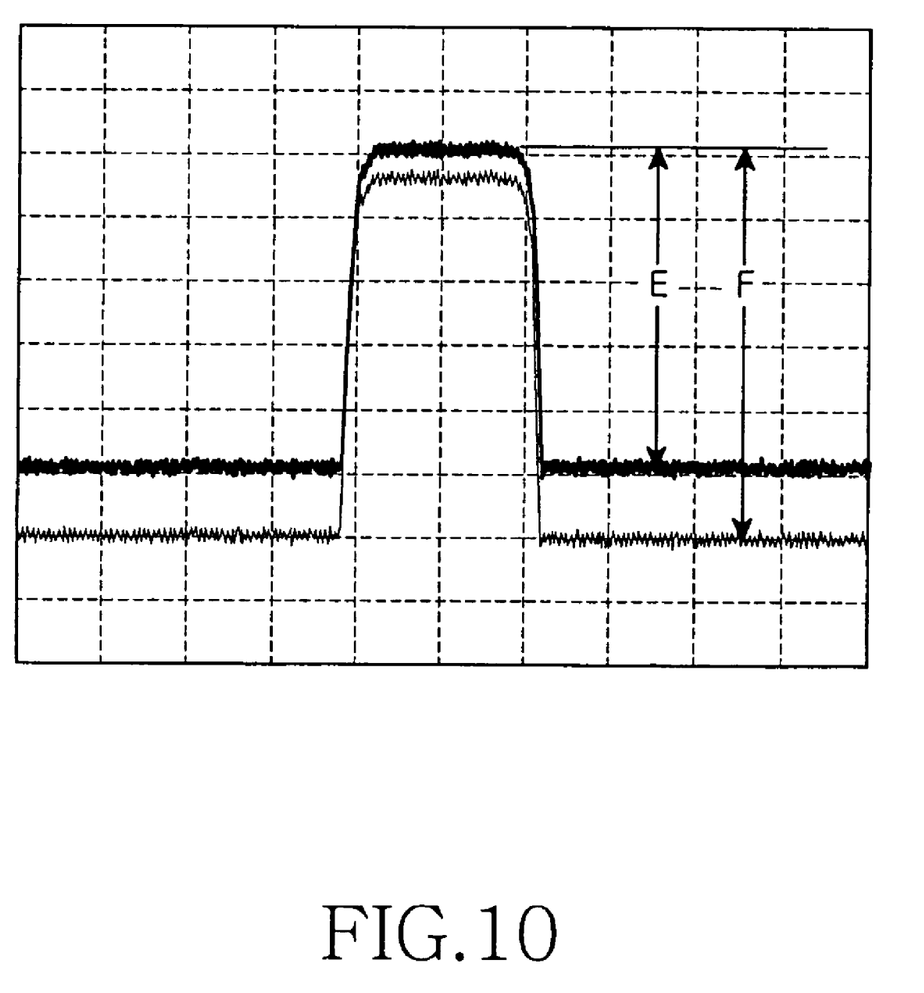
FIG. 10 is a spectrum illustrating a spurious characteristic in an output voltage of a high power amplifier when an average input voltage is reduced in a high power amplifier according to an embodiment of the present invention.

FIG. 10 is a spectrum illustrating a spurious characteristic in an output voltage of a high power amplifier when the average input voltage is reduced in the high power amplifier performing functions according to an embodiment of the present invention. Referring to FIG. 10, a spurious characteristic E in an average maximum output voltage of the high power amplifier, when the amount Atn of attenuation of the variable attenuator 703 is adjusted, is identical to the spurious characteristic B in the average maximum output voltage of the high power amplifier when the bias adaptation scheme described with reference to FIG. 4 in the conventional technique is used.

In addition, as illustrated in FIG. 10, a spurious characteristic F in the output voltage when a signal having a smaller average input voltage is input to the high power amplifier is improved when compared with the spurious characteristic E, thereby compensating the spurious characteristic D in an output voltage when an input average voltage provided to the high power amplifier is lowered and when the bias adaptation scheme is employed, which is described with reference to FIG. 6 in the conventional technique.

The envelope detector 705 receives a signal output from the coupler 711, detects the envelope of the received signal, and removes a high frequency component from the received signal having undergone the coupling operation, in order to output only the envelope of the input signal to the wave shaper 707. The wave shaper 707 receives the envelope output from the envelope detector 705, controls the magnitude of the envelope of the input signal in such a manner that the input signal has a predetermined waveform, and outputs an alternating current (AC) voltage swinging only above predetermined voltage intensity to the voltage adder 709.

The voltage adder 709 receives the AC voltage output from the wave shaper 707 and the direct current bias DC_bias applied to the high power amplifier in order to add the AC voltage to the direct current bias DC_bias and outputs the resultant value, i.e., a bias adaptation bias V_bias provided as a bias of the transistor 717, to the transistor 717. The transistor 717 receives an input signal having undergone the coupling operation output from the coupler 711, amplifies the received signal in such a manner that the received signal has a predetermined gain corresponding to the bias adaptation bias V_bias, and then outputs the amplified signal.

As a result, in FIG. 7, the RMC detector 713 and the DC level adjuster 715 are included in an attenuation adjustment block for adjusting the amount Atn of the attenuation of the variable attenuator 703, and the variable attenuator 703, the envelope detector 705, the wave shaper 707, and the voltage adder 709 are included in a bias adaptation bias creating block for creating the bias adaptation bias V_bias.

As described above, according to the present invention, an input signal applied to a high power amplifier using a bias adaptation scheme is amplified to a signal having high power regardless of the intensity of an average input voltage of the input signal, thereby improving a spurious characteristic in an output voltage according to a degradation of an average input voltage intensity.

While the present invention has been shown and described with reference to certain preferred embodiments thereof, it will be understood by those skilled in the art that various changes in form and details may be made therein without departing from the spirit and scope of the invention. Consequently, the scope of the invention should not be limited to the embodiments, but should be defined by the appended claims and equivalents thereof.

What is claimed is:

1. An apparatus for controlling a bias adaptation bias of a high power amplifier, the apparatus comprising:
    a coupler for coupling an input signal to have a predetermined voltage;
    an amplification element for amplifying the coupled input signal corresponding to a bias adaptation bias created according to a predetermined control operation; and
    a bias adaptation block for adjusting an amount of attenuation used for attenuating a voltage of the coupled input signal corresponding to the voltage of the coupled input signal and creating the bias adaptation bias corresponding to a voltage obtained by attenuating the voltage of the coupled input signal by the amount of the attenuation.

2. The apparatus as claimed in claim 1, wherein the bias adaptation block comprises:
    a power divider for dividing power of the coupled input signal;
    an attenuation adjustment block for converting a voltage of a power-divided signal into a direct current voltage and creating a control voltage used for adjusting the amount of the attenuation corresponding to the direct current voltage; and
    a bias adaptation bias creating block for determining the amount of the attenuation corresponding to the control voltage, detecting an envelope of a signal obtained by decreasing the voltage of the coupled input signal by the amount of the attenuation, creating an alternating current voltage swinging only above a predetermined voltage by adjusting the envelope in such a manner that the envelope has a predetermined wave form, and creating the bias adaptation bias by adding the alternating current voltage to a direct current voltage provided to the high power amplifier.

3. The apparatus as claimed in claim 2, wherein the attenuation adjustment block comprises:
    a root mean square detector for converting the voltage of the power-divided signal into the direct current voltage; and
    a direct current level adjustor for creating the control voltage corresponding to the direct current voltage.

4. The apparatus as claimed in claim 2, wherein the bias adaptation bias creating block comprises:
    a variable attenuator for determining the amount of the attenuation corresponding to the control voltage and decreasing the voltage of the coupled input signal by the amount of the attenuation;
    an envelope detector for detecting an envelope of a signal output from the variable attenuator;
    a wave shaper for receiving the envelope of the signal and creating the alternating current voltage swinging only above the predetermined voltage by adjusting the envelope in such a manner that the envelope has the predetermined wave form; and
    a voltage adder for creating the bias adaptation bias by adding the alternating current voltage to the direct current voltage provided to the high power amplifier.

5. The apparatus as claimed in claim 1, wherein the coupler couples the input signal to the predetermined voltage by compensating for the amount of the attenuation.

6. A method for controlling a bias adaptation bias of a high power amplifier, the method comprising the steps of:
    coupling an input signal to have a predetermined voltage;
    adjusting an amount of attenuation used for attenuating a voltage of the coupled input signal corresponding to the voltage of the coupled input signal;
    creating a bias adaptation bias corresponding to a voltage obtained by attenuating the voltage of the coupled input signal by the amount of the attenuation; and
    amplifying the coupled input signal corresponding to the bias adaptation bias.

7. The method as claimed in claim 6, wherein the step of creating the bias adaptation bias comprises the steps of:
    dividing a power of the coupled input signal;
    converting a voltage of a power-divided signal into a direct current voltage;
    creating a control voltage used for adjusting the amount of the attenuation corresponding to the direct current voltage;
    determining the amount of the attenuation corresponding to the control voltage;
    detecting an envelope of a signal obtained by decreasing the voltage of the coupled input signal by the amount of the attenuation;
    creating an alternating current voltage swinging only above a predetermined voltage by adjusting the envelope in such a manner that the envelope has a predetermined wave form; and
    creating the bias adaptation bias by adding the alternating current voltage to a direct current voltage provided to the high power amplifier.

8. The method as claimed in claim 6, wherein, in the step of coupling the input signal to have the predetermined voltage is performed in such a manner that the input signal has the predetermined voltage by compensating for the amount of the attenuation.

* * * * *